(12) United States Patent
Shitagaki et al.

(10) Patent No.: US 7,345,417 B2
(45) Date of Patent: Mar. 18, 2008

(54) LIGHT EMITTING DEVICE

(75) Inventors: Satoko Shitagaki, Kanagawa (JP); Satoshi Seo, Kanagawa (JP); Harue Nakashima, Kanagawa (JP); Hiroko Yamazaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 368 days.

(21) Appl. No.: 10/738,217

(22) Filed: Dec. 18, 2003

(65) Prior Publication Data

US 2004/0265624 A1 Dec. 30, 2004

(30) Foreign Application Priority Data

Dec. 19, 2002 (JP) .............................. 2002-368731
Dec. 27, 2002 (JP) .............................. 2002-379235

(51) Int. Cl.
H05B 33/00 (2006.01)
H01J 1/65 (2006.01)

(52) U.S. Cl. ................. 313/503; 313/504; 313/505; 313/506

(58) Field of Classification Search ............... 428/690; 313/502–506
See application file for complete search history.

(56) References Cited

U.S. PATENT DOCUMENTS 5,466,950 A * 11/1995 Sugawara et al. ............ 257/94
6,281,627 B1 * 8/2001 Arai et al. ................... 313/506
6,338,908 B1 * 1/2002 Arai et al. ................... 428/690
6,458,475 B1 * 10/2002 Adachi et al. ............... 428/690
6,541,909 B1 * 4/2003 Motomatsu ................. 313/504
6,566,807 B1 * 5/2003 Fujita et al. ................. 313/506
6,693,352 B1 * 2/2004 Huang et al. ................ 257/743
6,916,554 B2 * 7/2005 Ma et al. ..................... 428/690
2001/0052751 A1 12/2001 Wakimoto et al.

FOREIGN PATENT DOCUMENTS

| JP | 03-077299 | 4/1991 |
| JP | 2001-110569 | 4/2001 |
| JP | 2001-237079 | 8/2001 |
| JP | 2002-033197 | 1/2002 |
| JP | 2002-100479 | 4/2002 |

OTHER PUBLICATIONS

English translation of Detailed Description of JP 2001-237079.*
Kwong et al.; "High operational stability of electrophosphorescent devices"; *Applied Physics Letters*, vol. 81, No. 1; pp. 162-164; Jul. 1, 2002.

(Continued)

Primary Examiner—Edward J. Glick
Assistant Examiner—Anastasia S. Midkiff
(74) Attorney, Agent, or Firm—Fish & Richardson P.C.

(57) ABSTRACT

An organic light-emitting device is manufactured, which is formed laminating an electroluminescent layer (111) including an electroluminescent organic compound and a cathode (109) sequentially on anode (101). The electroluminescent layer (111) has a hole blocking layer (106), and this hole blocking layer (106) is formed of two or more kinds of materials. It is possible to manufacture a high-efficiency and high-reliability organic light-emitting device by introducing the hole blocking layer like this.

18 Claims, 8 Drawing Sheets

OTHER PUBLICATIONS

Watanabe et al.; Optimization of driving lifetime durability in organic LED devices using Ir Complex; *Proceedings of SPIE* vol. 4105; pp. 175-182; 2001.

Tsutsui et al.; "High Quantum Efficiency in Organic Light-Emitting Devices with Iridium-Complex as a Triplet Emissive Center"; *Japan Journal of Applied Physics* vol. 38, Part 2, No. 12B; pp. L1502-L1504; 1999.

Baldo et al.; "Very high-efficiency green organic light-emitting devices based on electrophosphorescence"; *Applied Physics Letters*, vol. 75, No. 1; pp. 4-6; 1999.

Kijima et al.; "A Blue Organic Light Emitting Diode"; *Japan Journal of Applied Physics*, vol. 38, Part 1, No. 9A; pp. 5274-5277; 1999.

Adachi et al.; "Electroluminescence in Organic Films with Three-Layer Structure"; *Department of Materials Science and Technology, Graduate School of Engineering Sciences, Kyushu University*; pp. L269-L271; 1998.

Tang et al.; "Organic electroluminescent diodes"; *Applied Physics Letters 51*(12); pp. 913-915; 1987.

Search Report (Application No. PCT/JP03/16027) dated Feb. 3, 2004.

International Preliminary Examination Report (Application No. PCT/JP03/16027) in Japanese; dated Mar. 2, 2004.

International Preliminary Examination Report (Application No. PCT/JP03/16027)—English language translation; dated Mar. 2, 2004.

\* cited by examiner

Fig. 2
(a)
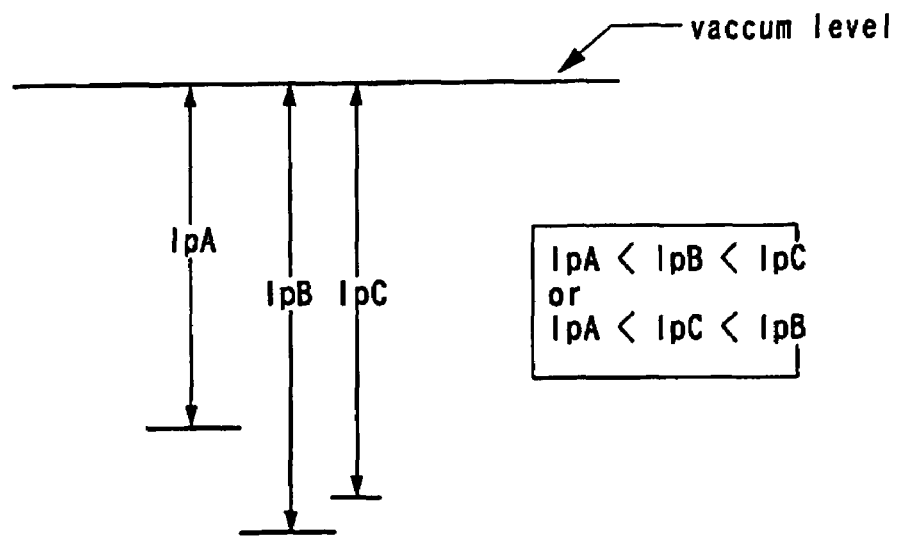
(b)
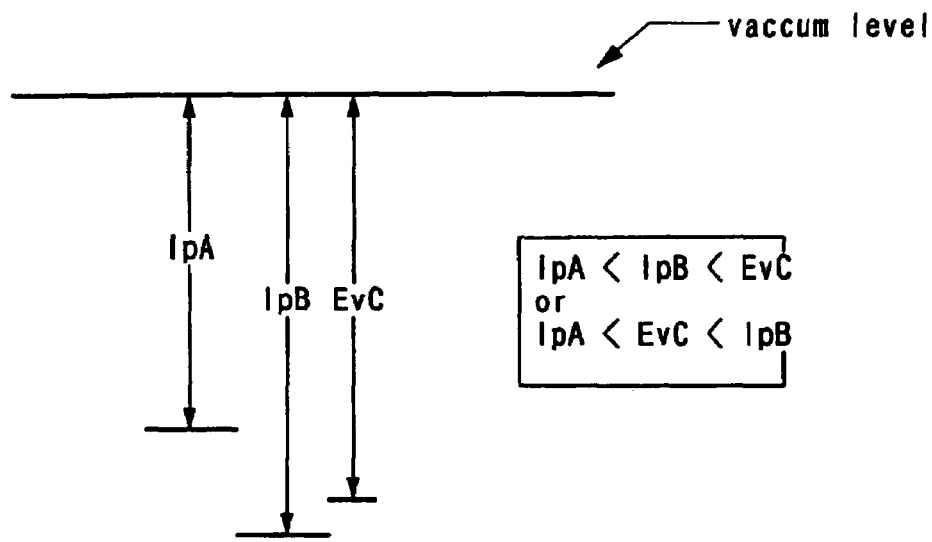

Fig. 3
(a)
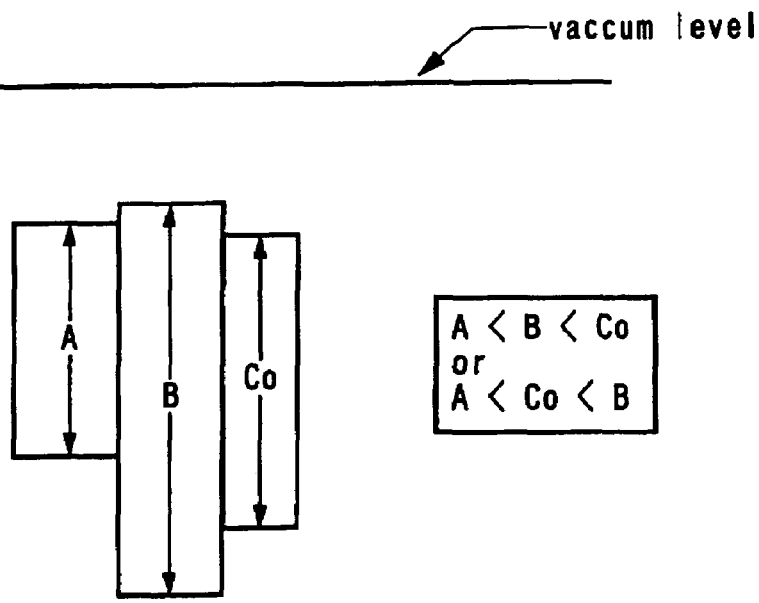
(b)
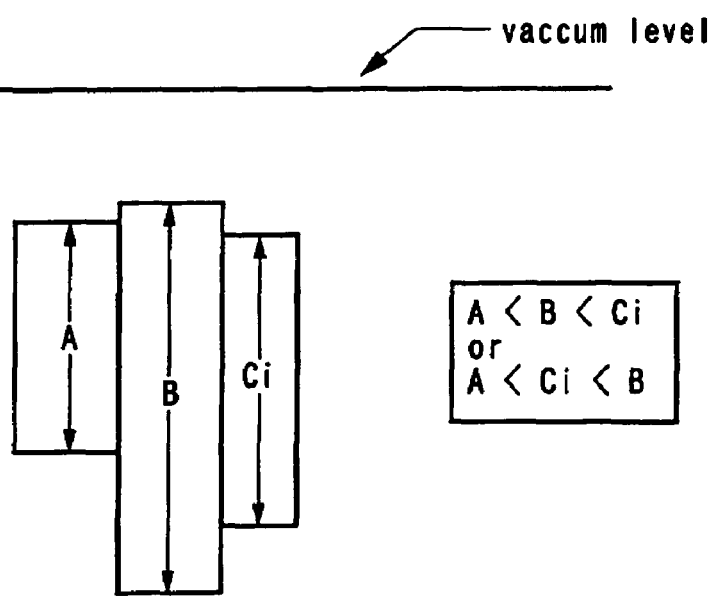

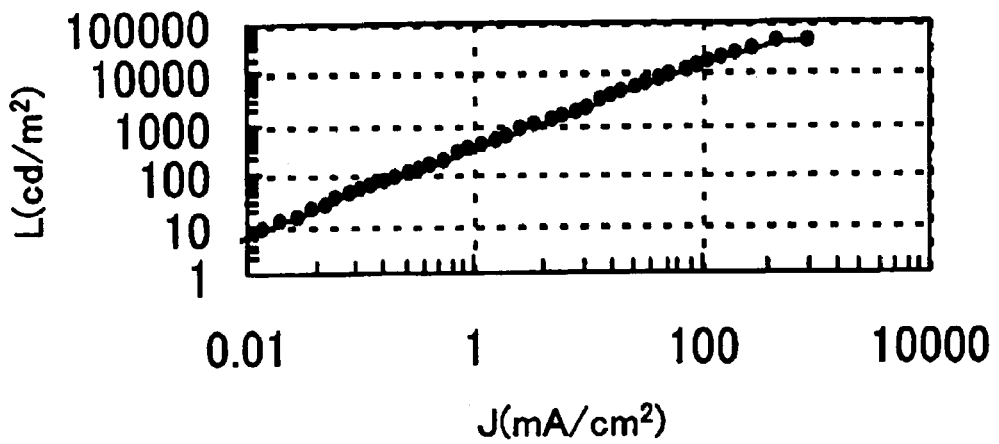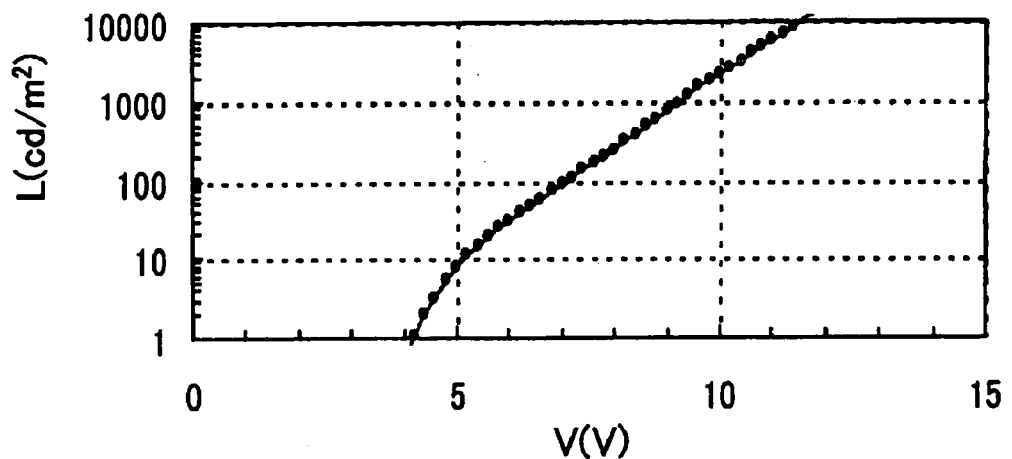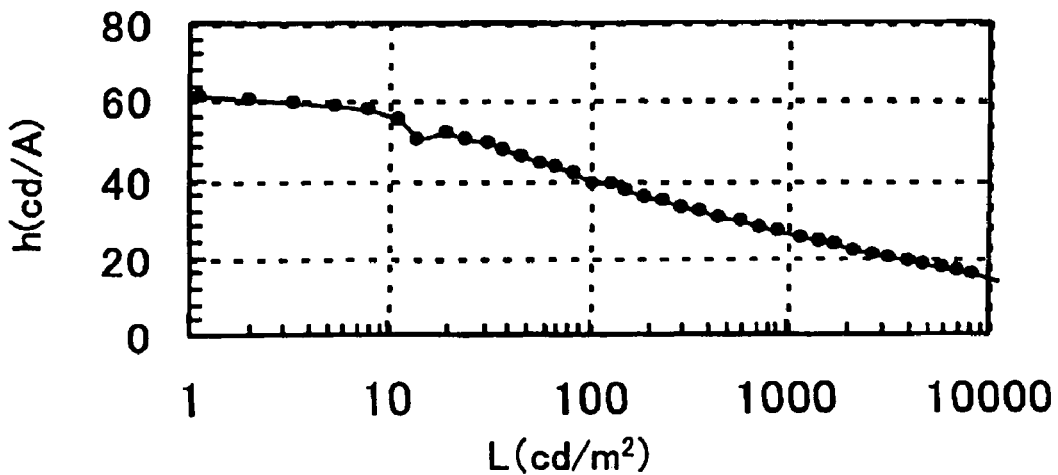
Fig.5

Fig. 8
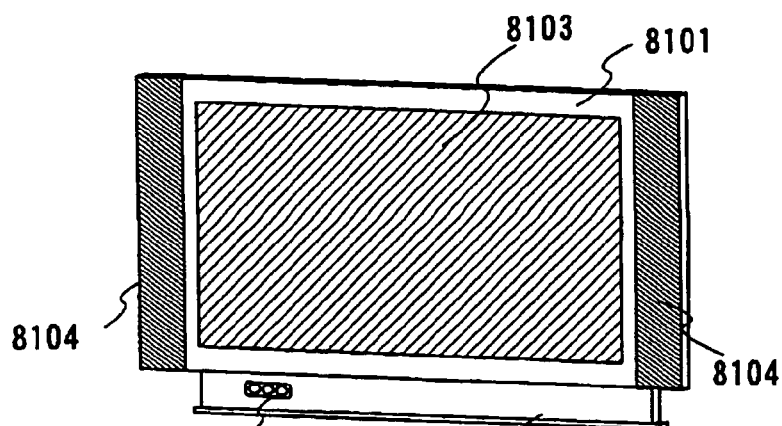
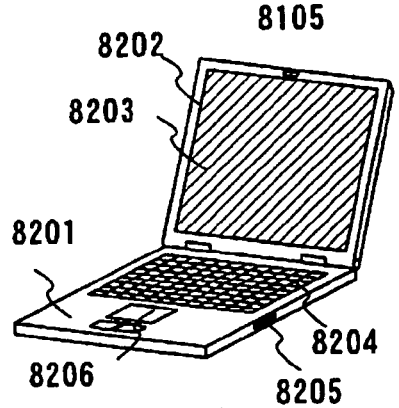
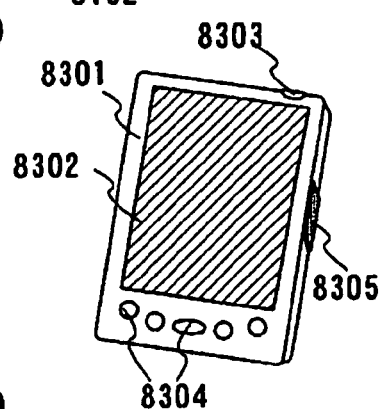
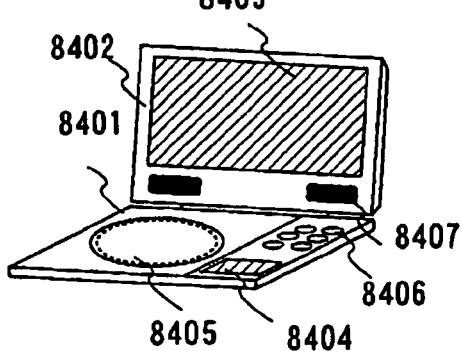
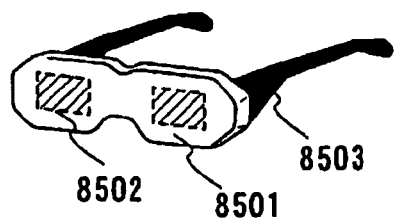
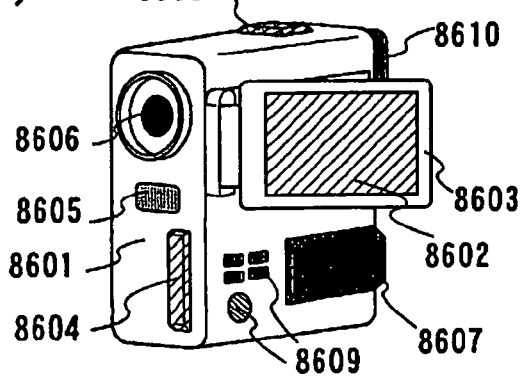
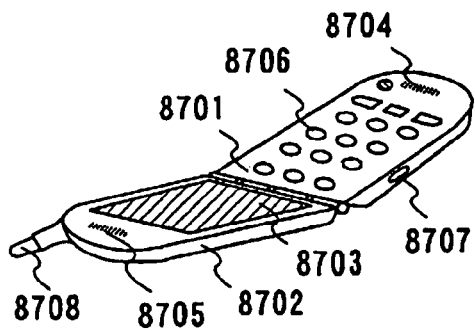

LIGHT EMITTING DEVICE

TECHNICAL FIELD

The present invention relates to an organic electroluminescent device that has an organic compound from which light emission can be obtained when an electric field is applied (hereinafter, referred to as "an organic light-emitting device").

BACKGROUND ART

An organic light-emitting device has features such as favorable a merit of visibility for a self light-emitting, planar light emission to make a sharp thin, lightness in weight, being driven at a low voltage, and being capable of multicolor and full-color displaying, has got a lot of attention as a next-generation display device, and has been expected to be applied to flat panel displays.

It is a fundamental structure in a current organic light-emitting device that Tang et al. of Eastman Kodak Company reported in 1987 (refer to Non-Patent Document 1).

(Non-Patent Document 1)

C. W. Tang and S. A. Vanslyke, "Organic electroluminescent diodes", Applied Physics Letters, vol. 51, No. 12, 913-915 (1987)

In Non-Patent Document 1, a sufficient luminance of 100 cd/m$^2$ at 5.5 V is attained by making an uniform extra-thin film with a thickness of approximately 100 nm as an organic thin film, selecting an electrode material to make a carrier injection barrier against the organic thin film smaller, and introducing a heterostructure (a two-layer structure).

Further, the organic light-emitting device in Non-Patent Document 1 in a manner has an origin of an idea of a functional separation of layers, where a transport of a hole is carried out by a hole transporting layer and a transport of an electron and light emission are carried out by an electron-transporting light-emitting layer. The idea of this functional separation is further developed into an idea of a double heterostructure (a three-layer structure), where a light-emitting layer is interposed between a hole transporting layer and an electron transporting layer (refer to Non-Patent Document 2).

(Non-Patent Document 2)

Chihaya ADACHI, Shozuo TOKITO, Tetsuo TSUTSUI and Shogo SAITO, "Electroluminescence in Organic Films with Three-Layered Structure", Japanese Journal of Applied Physics, Vol. 27, No. 2, L269-L271 (1988)

The functional separation of layers has an advantage that it becomes unnecessary to make one type of organic material have various functions (such as a light emission, a carrier transport, and a carrier injection from an electrode) at the same time so that a molecular design of a material to be used for a device is allowed to have a wide range of flexibility (For example, it becomes unnecessary to search a bipolar material by constraint). Then, an advantage of a material is effectively utilized to enable an improvement of a luminous efficiency easily by combining each of various materials such as a material that has a favorable light-emission characteristic, a material that is superior in transporting a carrier, a material that is superior in injecting a carrier. In this way, many of current organic light-emitting device have a multilayer structure.

Some of multilayer organic light-emitting devices utilizing this functional separation of layers have a structure where an electron transporting material into which a hole is hard to inject due to a large ionization potential, that is, a hole-blocking electron transporting material (hereinafter, referred to as "a hole blocking material") is used as a hole blocking layer.

As described above, the hole blocking layer has a large ionization potential, and it is quite difficult to inject a hole into the hole blocking layer. Therefore, a hole carrier injected into a light-emitting layer is not allowed to enter the adjacent hole blocking layer to be kept in the light-emitting layer. Then, a hole or electron density is increased in the light-emitting layer to recombine the carriers efficiently, and the organic light-emitting device can be highly efficient by this efficient recombination of carriers.

In addition, since this hole blocking function makes it possible to control a recombination region of carriers, it is also possible to control a color of a light emission of the organic light-emitting device.

For example, there is a report that the hole transporting layer is successfully made to emit light by inserting a hole blocking layer between a hole transporting layer and an electron transporting layer (refer to Non-Patent Document 3).

(Non-Patent Document 3)

Yasunori KIJIMA, Nobutoshi ASAI and Shin-ichiro TAMURA, "A Blue organic Light Emitting Diode", Japanese Journal of Applied Physics, Vol. 38, 5274-5277 (1999)

Here, a mechanism of keeping a hole in the transporting layer by the introduction of the hole blocking layer and recombining carriers in the hole transporting layer is working.

In addition, as an application example of a hole blocking layer, there is an example of being applied to a triplet light-emitting device (refer to Non-Patent Document 4).

(Non-Patent Document 4)

M. A. Baldo, S. Lamansky, P. E. Burrows, M. E. Thompson and S. R. Forrest, "Very high-efficiency green organic light-emitting devices based on electrophosphorescence", Applied Physics Letters, Vol. 75, No. 1, 4-6 (1999)

Although a triplet light-emitting device is an efficient technique for a high-efficiency organic light-emitting device, a hole blocking material is an important key since light cannot be emitted efficiently when no hole blocking layer is used.

In this way, a hole blocking material is a material that can be used quite efficiently. However, a material that has a highly electron-transporting property and a favorable hole blocking property is limited to a large degree under present circumstances. Although few examples thereof include, for example, 2,9-dimethyl-4,7-diphenyl-1,10-phenanthroline (hereinafter, referred to as "BCP") that is used also in Non-Patent Document 3 and Non-Patent Document 4, in addition, 1,3-bis [(4-tert-buthylphenyl)-1,3,4-oxadiazole] phenylene (hereinafter, referred to as "OXD-7"), and 3-phenyl-4-(1'-naphthyl)-5-phenyl-1,2,4-triazole (hereinafter, referred to as "TAZ"), a deposited thin film is severely crystallized as for every material, and reliability is adversely affected significantly in the case of being applied to an actual device. For example, a triplet light-emitting device using BCP has a device life (a half life of a luminance) of 170 hours at an initial luminance of 500 cd/m$^2$, which is really far from a level in practice use (refer to Non-Patent Document 5).

(Non-Patent Document 5)

Tetsuo TSUTSUI, Moon-Jae YANG, Masayuki YAHIRO, Kenji NAKAMURA, Teruichi WATANABE, Taishi TSUJI, Yoshinori FUKUDA, Takeo WAKIMOTO and Satoshi MIYAGUCHI, "High Quantum Efficiency inorganic Light-Emitting Devices with Iridium-Complex as a Triplet Emissive Center", Japanese Journal of Applied Physics, Vol. 38, No. 12B, L1502-L1504 (1999)

On the other hand, in order to overcome this point, there is an example where (2-methyl-8-quinolinolato)-(4-hydroxy-biphenylyl)-aluminum (hereinafter, referred to as 'BAlq') that is a material that is hard to crystallize is applied to a hole blocking layer to manufacture a triplet light-emitting device (refer to Non-Patent Document 6).

(Non-Patent Document 6)

Teruichi WATANABE, Kenji NAKAMURA, Shin KAWAMI, Yoshinori FUKUDA, Taishi TUJI, Takeo WAKIMOTO and Satoshi MIYAHUCHI, "Optimization of driving lifetime durability in organic LED devices using Ir complex", Proceeding SPIE, vol. 4105, 175 (2000)

In Non-Patent Document 6, it is reported that while a half life of a luminance (an initial luminance of 600 to 1200 $cd/M^2$) is 700 hours or less in the case of using BCP as a hole blocking layer, a half life of a luminance (an initial luminance of 570 $cd/m^2$) is remarkably extended to about 4000 hours in the case of using BAlq.

However, as compared to a device using BCP, a device using BAlq has an efficiency adversely decreased considerably. This means that, as compared to BCP, BAlq is inferior in hole blocking property while being hard to crystallize (a quality of film is stable).

Further, in a triplet light-emitting device, data is reported where various hole blocking materials are used to compare a half life of a luminance in each device (refer to Non-Patent Document 7).

(Non-Patent Document 7)

Raymond C. KWONG, Matthew R. NUGENT, Lech MICHALSKI, Tan NGO, Kamala RAJAN, Yeh-Jiun TUNG, Michael S. WEAVER, Theodore X. ZHOU, Michael HACK, Mark E. THOMPSON, Stephen R. FORREST and Julie J. BROWN, "High operational stability of electrophosphorescent devices", Applied Physics Letters, Vol. 81, No. 1, 162-164 (2002)

In Non-Patent Document 7, TPBI that has a quite highly hole blocking property is used, and it is proven that a half life of a luminance of a device that has a quite high luminous efficiency is a several orders of magnitude lower as compared to a half time of a luminance of a device using BAlq.

As these reports, it has never reported that a half life of a luminance is long to be able to obtain high reliability in a device that has a highly hole blocking material applied to a hole blocking layer. A cause for this is that crystallization of a material that is used for a hole blocking layer is severe as cited in the example of BCP. In other words, stability of a quality of film in a thin film state is lacking, and therefore, high reliability cannot be obtained.

Accordingly, a hole blocking layer that has a highly hole blocking property and stability of a quality of film is desired.

DISCLOSURE OF INVENTION

Problem to be Solved by the Invention

In consequence, it is an object of the present invention to provide a hole blocking layer that has a favorable quality of film in addition to a superior hole blocking property. In addition, it is an object of the present invention to provide a high-efficiency organic light-emitting device that has high stability of driving by using it.

Means for Solving the Problem

According to the present invention, even in the case of a hole blocking layer using a conventional hole blocking material that is easy to crystallize, reliability of a device to which the hole blocking layer is applied is improved without dropping a hole blocking performance by adding a material that is different from the hole blocking material.

Accordingly, according to the present invention, an organic light-emitting device that has at least an anode, a cathode, a light-emitting layer provided between the anode and the cathode, and a hole blocking layer provided in contact with a cathode side of the light-emitting layer is characterized in that the hole blocking layer comprises a hole blocking material that has a larger ionization potential than an ionization potential of the light-emitting layer and one kind or plural kinds of materials, which are different from the hole blocking material.

The "organic light-emitting device" mentioned in the specification indicates an organic electroluminescent device that has an organic compound from which light emission can be obtained when an electric field is applied, which may comprise only a plurality of organic compounds or have at least more than one kind of organic material and an inorganic compound mixed, for example.

In this case, the material to be added to the hole blocking material is not allowed to block transporting an electron carrier into the light-emitting layer efficiently. Therefore, it is preferable that the material to be added is an n-type inorganic semiconductor or an n-type organic semiconductor that is able to transport an electron carrier.

Accordingly, according to the present invention, an organic light-emitting device that has at least an anode, a cathode, a light-emitting layer provided between the anode and the cathode, and a hole blocking layer provided in contact with a cathode side of the light-emitting layer is characterized in that the hole blocking layer comprises a hole blocking material that has a larger ionization potential than an ionization potential of the light-emitting layer and an n-type organic semiconductor that is different from the hole blocking material.

Alternatively, an organic light-emitting device that has at least an anode, a cathode, a light-emitting layer provided between the anode and the cathode, and a hole blocking layer provided in contact with a cathode side of the light-emitting layer is characterized in that the hole blocking layer comprises a hole blocking material that has a larger ionization potential than an ionization potential of the light-emitting layer and an n-type inorganic semiconductor.

Here, also in order to prevent deteriorating a hole blocking performance of the hole blocking layer to decrease a luminous efficiency of the device when the n-type organic semiconductor or the n-type inorganic semiconductor is added to the hole blocking material, it is also an important means to select the material to be added to the hole blocking material.

Therefore, in the case of adding the n-type organic semiconductor, it is preferable that the n-type organic semiconductor to be added has a larger ionization potential than an ionization potential of the light-emitting layer or has a larger value of an energy gap than a value of an energy gap of the light-emitting layer.

Note that, in the specification, the value of the energy gap indicates an energy value of an absorption edge of an absorption spectrum of a thin film.

In addition, in the case of adding the n-type inorganic semiconductor, it is preferable that a top of a valence band of the n-type inorganic semiconductor shows a larger value than an ionization potential of the light-emitting layer or a value of an energy gap of the n-type inorganic semiconductor is larger than a value of an energy gap of the light-emitting layer.

Accordingly, according to the present invention, an organic light-emitting device that has at least an anode, a cathode, a light-emitting layer provided between the anode and the cathode, and a hole blocking layer provided in contact with a cathode side of the light-emitting layer is characterized in that the hole blocking layer comprises a hole blocking material that has a larger ionization potential than the light-emitting layer and an n-type organic semiconductor that has a larger ionization potential than the light-emitting layer.

Further, as another means, an organic light-emitting device that has at least an anode, a cathode, a light-emitting layer provided between the anode and the cathode, and a hole blocking layer provided in contact with a cathode side of the light-emitting layer is characterized in that the hole blocking layer comprises a hole blocking material that has a larger ionization potential than the light-emitting layer and an n-type organic semiconductor that has a larger value of an energy gap than a value of an energy gap of the light-emitting layer.

Further, according to the present invention, an organic light-emitting device that has at least an anode, a cathode, a light-emitting layer provided between the anode and the cathode, and a hole blocking layer provided in contact with a cathode side of the light-emitting layer is characterized in that the hole blocking layer comprises a hole blocking material that has a larger ionization potential than the light-emitting layer and an n-type inorganic semiconductor where a top of a valence band has a larger value than an ionization potential of the light-emitting layer.

Further, as another means, an organic light-emitting device that has at least an anode, a cathode, a light-emitting layer provided between the anode and the cathode, and a hole blocking layer provided in contact with a cathode side of the light-emitting layer is characterized in that the hole blocking layer comprises a hole blocking material that has a larger ionization potential than the light-emitting layer and an n-type inorganic semiconductor that has a larger value of an energy gap than a value of an energy gap of the light-emitting layer.

Moreover, as another means, an organic light-emitting device that has at least an anode, a cathode, a light-emitting layer provided between the anode and the cathode, and a hole blocking layer provided in contact with a cathode side of the light-emitting layer is characterized in that the hole blocking layer comprises a hole blocking material that has a larger ionization potential than the light-emitting layer and an n-type organic semiconductor that is different from the hole blocking material, and a value of the ionization potential of the hole blocking layer is 0.4 eV or more larger than a value of an ionization potential of the light-emitting layer.

Further, an organic light-emitting device that has at least an anode, a cathode, a light-emitting layer provided between the anode and the cathode, and a hole blocking layer provided in contact with a cathode side of the light-emitting layer is characterized in that the hole blocking layer comprises a hole blocking material that has a larger ionization potential than the light-emitting layer and an n-type organic semiconductor that is different from the hole blocking material, and a value of the ionization potential of the hole blocking layer is 5.8 eV or more.

Further, according to the present invention, an organic light-emitting device that has at least an anode, a cathode, a light-emitting layer provided between the anode and the cathode, and a hole blocking layer provided in contact with a cathode side of the light-emitting layer is characterized in that the hole blocking layer comprises a hole blocking material that has a larger ionization potential than the light-emitting layer and an n-type inorganic semiconductor, and a value of the ionization potential of the hole blocking layer is 0.4 eV or more larger than a value of an ionization potential of the light-emitting layer.

Further, as another means, an organic light-emitting device that has at least an anode, a cathode, a light-emitting layer provided between the anode and the cathode, and a hole blocking layer provided in contact with a cathode side of the light-emitting layer is characterized in that the hole blocking layer comprises a hole blocking material that has a larger ionization potential than the light-emitting layer and an n-type inorganic semiconductor, and a value of the ionization potential of the hole blocking layer is 5.8 eV or more.

Effect of the Invention

Since a hole blocking layer that has a favorable film formation in addition to a superior hole blocking property can be provided by implementing the present invention, a high-efficiency organic light-emitting device that has high stability of driving can be manufactured.

BRIEF DESCRIPTION OF DRAWINGS

FIGS. 2(a) and 2(b) are diagrams showing energy potential of a material to be used for a hole blocking layer.

FIGS. 3(a) and 3(b) are diagrams showing an energy diagram of a material to be used for a hole blocking layer.

FIG. 5 is a diagram showing initial characteristics of Comparative Example 1.

FIGS. 8(A) to 8(G) are diagrams showing examples of electronic appliances.

BEST MODE FOR CARRYING OUT THE INVENTION

Figure 1:
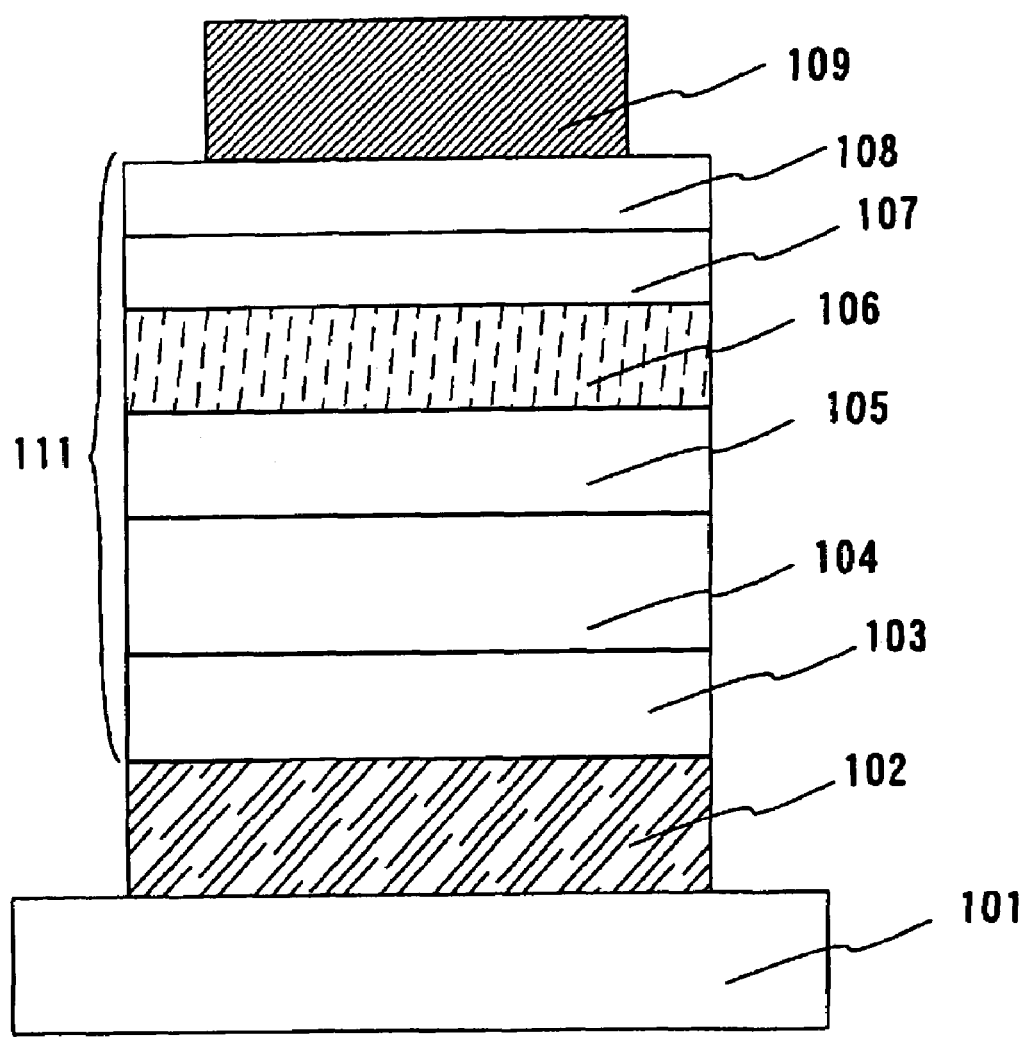
FIG. 1 is a diagram showing a fundamental structure of the present invention.

Hereinafter, an embodiment mode of the present invention will be described in detail. In order to extract a light emission, one of an anode and a cathode is necessarily transparent. However, in the present embodiment mode, a device structure where a transparent anode is formed over a substrate and light is extracted from the anode side will be described. Actually, it is also possible to be applied to a structure where a cathode is formed over a substrate and light is extracted from the cathode side, a structure where light is extracted from a side opposite to a substrate, and a structure where light is extracted from both sides of electrodes.

In the present invention, a device to which a hole blocking layer is applied is characterized in that the hole blocking layer of the device comprises a hole blocking material and another material.

What is essential to make a concept of an organic light-emitting device with high reliability is a form of stable amorphous thin film of a material to be used for the device. An organic layer in an organic light-emitting device comprises an amorphous thin film, and the thin film has a thickness of only several tens nm, approximately 100 nm in a total of respective layers. In driving, a voltage close in value to 10 V is applied thereto. Therefore, in order to withstand a high electric field to develop stable device characteristics, uniform and dense amorphous thin film form without a pinhole is required.

Keeping this uniform and dense amorphous thin film leads to an improvement of reliability, which leads to an object of how to suppress aggregation or crystallization of the amorphous thin film.

A material of which aggregation or crystallization of an amorphous thin film is severe includes a material that has a low grass transition and a strong interaction between molecules. In the case of using these materials to form a thin film, a rearrangement of molecules is likely to occur from a disorderly amorphous state to an orderly crystalline state, and a crystal is therefore formed partially in the film. Then, an electric current is focused on flowing into this crystal portion, which leads to destruction of the device.

In order to suppress aggregation or crystallization of a thin film, it is the best solution to use a material that is hard to crystallize, which however is not able to consistently take advantage of superior characteristics of the material. For example, a lot of materials exist, of which crystallization of a thin film is severe while being superior in electron transporting property, and these materials are now avoided from being applied to a device as materials that are difficult to apply to an organic light-emitting device.

Here, attention is focused on a point of an improvement of reliability by a doping technique. In a conventional organic light-emitting device, there is a reported improvement of reliability of a device by a technique of doping a light-emitting layer with a pigment. The improvement of reliability has various factors depending on dopant molecules to be applied. However, a common factor includes uniformity and amorphous nature of a shape of a thin film. An Alq$_3$ thin film has observed morphology of becoming a smoother film by doping with rubrene, and it is reported that contact with a cathode to be formed thereon is improved by the improvement of the film in quality, which leads to the improvement of reliability of the device.

In this way, a thin film can be improved in quality by doping the thin film comprising a single molecule with a different material. This technique can be applied to not only a light-emitting layer but also another layers, and even a material of which crystallization is severe, which has not been applied to an organic light-emitting device before, is considered to become able to be used for the device.

Consequently, in a device structure according to the present invention, reliability of the device can be improved by applying uniformity and amorphous nature of a form of a quality of a film by this doping technique to a hole blocking layer even when a hole blocking material is used of which crystallization is severe while having superior properties such as a carrier transporting property and a hole blocking property.

In this case, it is necessary to select a doping material that is added to the hole blocking material.

First, the hole blocking layer needs to transport an electron carrier efficiently to an adjacent light-emitting layer. In other words, the hole blocking layer is required to have an electron transporting property. Consequently, as in the device according to the present invention, even in the hole blocking layer where the hole blocking material is doped with another material, an electron transporting property is needed. Intrinsically, in a hole blocking layer of a hole blocking material alone, the hole blocking material itself is a material that has a transporting property, and therefore, can transport an electron carrier. Adding another material to this is not allowed to degrade this original electron-transporting property.

Consequently, it is preferable that the material that is added to the hole blocking layer is an n-type organic semiconductor or an n-type inorganic semiconductor, which has an ability to transport an electron carrier.

Now, an original function of a hole blocking layer aims for an effect of keeping a hole in a light-emitting layer. The magnitude of this effect is determined by magnitude of a difference between an ionization potential of the light-emitting layer and an ionization potential of the hole blocking layer.

Consequently, also in a hole blocking layer that is applied in the present invention, it is desired to have an ionization potential large enough to be able to block a hole and keep a hole carrier in a light-emitting layer.

For that purpose, it is necessary to consider a hole blocking performance of a material itself to be added to a hole blocking material. Consequently, it is preferable that the material to be added to the hole blocking material is a material that has a larger ionization potential than the light-emitting layer as the hole blocking material is, for example, when the material to be added is an n-type organic semiconductor. Alternatively, when the material to be added is an n-type inorganic semiconductor, it is preferable that a top value of a valence band of the n-type inorganic semiconductor is larger than an ionization potential of the light-emitting layer.

FIG. 2 is a diagram illustrating a positional state of potential energy of a material to be used for a device according to the present invention, where (a) is a diagram in the case of adding an n-type organic semiconductor and (b) is a diagram in the case of adding an n-type inorganic semiconductor. The material to be added may be selected to be a positional relationship of energy like this diagram. In other words, the material to be added may be selected to be $Ip_A < Ip_B < Ip_C$ or $Ip_A < Ip_C < Ip_B$ in the case of (a) where the n-type organic semiconductor is added, or to be $Ip_A < Ip_B < Ev_C$ or $Ip_A < Ev_C < Ip_B$ in the case of (b) where the n-type inorganic semiconductor is added, where the above-mentioned $Ip_A$, $Ip_B$, $Ip_C$, and $Ev_C$ represent an ionization potential of a light-emitting layer, an ionization potential of a hole blocking material, an ionization potential of the n-type organic semiconductor to be added, and an ionization potential of the n-type inorganic semiconductor (that is, corresponding to an energy difference between a top value of a valence band and a vacuum level here), respectively.

A hole blocking layer to which an n-type organic semiconductor or an n-type inorganic semiconductor selected under such a condition is added is allowed to have an ionization potential large enough to block a hole. In order to block a hole sufficiently, it is preferable that a difference between an ionization potential of a light-emitting layer and the ionization potential of this hole blocking layer is 0.4 eV or more.

Now, when a hole blocking layer has a large ionization potential, it becomes certainly possible to block a hole and recombine carriers in a light-emitting layer. However, an exciton due to this recombination of carriers is required to be prevented from moving from the light-emitting layer to the hole blocking layer. In other words, the hole blocking layer is required to have an effect of keeping the exciton in the light-emitting layer.

For this purpose, it is preferable that a value of an energy gap of the hole blocking layer is larger than a value of an energy gap of the light-emitting layer.

Consequently, in a device according to the present invention, it is preferable that a material to be added to a hole blocking material is a material that has a larger value of an energy gap than a value of an energy gap of a light-emitting layer, for example, when the material to be added is an n-type organic semiconductor. Alternatively, when the material to be added is an n-type inorganic semiconductor, it is desired that a value of an energy gap of the n-type inorganic semiconductor is larger than the value of the energy gap of the light-emitting layer.

FIG. 3 is a diagram illustrating an energy diagram of a material to be used for a device according to the present invention, where (a) shows a case of adding an n-type organic semiconductor and (b) shows a case of adding an n-type inorganic semiconductor. The material to be added may be selected to be an energy diagram of this diagram. In other words, when values of energy gaps of a light-emitting layer, a hole blocking material, and the n-type organic semiconductor to be added, each between, are represented by A, B, and $C_O$, respectively, the material to be added may be selected so that the values of the energy gaps A, B, and $C_O$ has a magnitude relation of A<B<$C_O$ or A<$C_O$<B. Alternatively, when a value of an energy gap (also referred to as a band gap) of the n-type inorganic semiconductor to be added between a top value of a valence band and a bottom value of a conduction band is represented by $C_i$, the material to be added may be selected so that the values of the energy gaps A, B, and $C_i$ has a magnitude relation of A<B<$C_i$ or A<$C_i$<B. Each of the values of the energy gaps corresponds to an energy value of an absorption edge of an absorption spectrum.

A hole blocking layer to which an n-type organic semiconductor or an n-type inorganic semiconductor selected under such a condition is added exerts sufficiently an effect of keeping an exciton in a light-emitting layer. In order to keep an exciton in a light-emitting layer, it is preferable that a value of an energy gap of this hole blocking layer is 5.8 eV or more.

Next, a device structure according to the present invention, a method of manufacturing the device, and materials to be used will be exemplified more specifically.

FIG. 1 shows an example of a fundamental device structure according to the present invention, where an anode 102 is laminated on a substrate 101, and a hole injecting layer 103 comprising a hole injecting material, a hole transporting layer 104 comprising a hole transporting material, a light-emitting layer 105, a hole blocking layer 106 comprising a hole blocking material and another material, an electron transporting layer 107 comprising an electron transporting material, an electron injecting layer 108 comprising an electron injecting material, and a cathode 109 are laminated thereon. Here, the light-emitting layer 105 is sometimes formed of only one kind of a luminescent material, but may be formed of two or more materials. In addition, a structure of a device according to the present invention is not to be considered limited to this structure.

In this way, the device structure can be used in an organic light-emitting device to which a generally-used hole blocking layer is applied. In addition to the laminated structure shown in FIG. 1 where the respective functional layer are laminated, there are wide-ranging variations such as a device using a polymer and a high-efficiency device as mentioned in Document 4, where a triplet luminescent material that emits light from a triplet excited state is used for a light-emitting layer. It is possible to apply also to a white light-emitting device that can be obtained by controlling a recombination region of carriers by a hole blocking layer to divide a light-emitting region into two regions, and the like.

As for a method of manufacturing the device shown in FIG. 1 according to the present invention, first, the hole injecting material, the hole transporting material, a luminescent material are deposited in sequence on the substrate 101 having the anode (ITO) 102, and then the hole blocking material and another one kind or plural kinds of materials are deposited by co-evaporation. Next, the electron transporting material and the electron injecting material are deposited, and the cathode 109 is lastly formed by deposition. As for a ratio of concentration in the co-evaporation of the hole blocking material and the material to be added, the ratio of concentration of the hole blocking material to the material to be added may be reversed as long as the formed hole blocking layer 106 satisfies the above-mentioned conditions. Last of all, sealing is carried out to obtain an organic light-emitting device according to the present invention.

Next, materials will be cited below, which are public for the hole injecting material, the hole transporting material, the electron transporting material, the electron injecting material, the hole blocking material, the material to be added to the hole blocking material, the luminescent material, or a cathode material.

As the hole injecting material, a porphyrin compound, phthalocyanine (hereinafter, referred to as "$H_2Pc$"), copper phthalocyanine (hereinafter, referred to as "CuPc"), and the like are efficient among organic compounds. In addition, a material that has a smaller value of an ionization potential than the hole transporting material to be used and has a hole transporting function can also be used as the hole injecting material. There is also a material of a conductive polymer chemically doped, which includes polyethylene dioxythiophene (hereinafter, referred to as "PEDOT") doped with polystyrene sulfonate (hereinafter, referred to as "PSS") and polyaniline. Also, a polymer of an insulator is efficient in terms of planarization of an anode, and polyimide (hereinafter, referred to as "PI") is often used. Further, an inorganic compound is also used, which includes an extra-thin film aluminum oxide (hereinafter, referred to as "alumina") in addition to a thin film of a metal such as gold or platinum.

It is an aromatic amine-based (that is, one having a bond of benzene ring-nitrogen) compound that is most widely used as the hole transporting material. A material that is widely used includes 4,4'-bis(diphenylamino)biphenyl (hereinafter, referred to as "TAD"), derivatives thereof such as 4,4'-bis[N-(3-methylphenyl)-N-phenyl-amino]-biphenyl (hereinafter, referred to as "TPD"), 4,4'-bis[N-(1-naphthyl)-N-phenyl-amino]-biphenyl (hereinafter, referred to as "α-NPD"), and star burst aromatic amine compounds such as 4,4',4"-tris(N,N-diphenyl-amino)-triphenylamine (hereinafter, referred to as "TDATA") and 4,4',4"-tris[N-(3-methylphenyl)-N-phenyl-amino]-triphenylamine (hereinafter, referred to as "MTDATA").

As the hole transporting material, a metal complex is often used, which includes a metal complex having a quinoline moiety or a benzoquinoline moiety such as Alq, and BAlq mentioned above, tris (4-methyl-8-quinolinolato) aluminum (hereinafter, referred to as "Almq"), or bis (10-hydroxybenzo[h]-quinolinato) beryllium (hereinafter, referred to as "BeBq"), and in addition, a metal complex having an oxazole-based or a thiazole-based ligand such as bis [2-(2-hydroxyphenyl)-benzoxazolato]zinc (hereinafter, referred to as "Zn(BOX)$_2$") or bis[2-(2-hydroxyphenyl)-benzothiazolato]zinc (hereinafter, referred to as Zn(BTZ)$_2$). Further, in addition to the metal complexes, oxadiazole derivatives such as 2-(4-biphenylyl)-5-(4-tert-butylphenyl)-1,3,4-oxadiazole (hereinafter, referred to as PBD) and OXD-7, triazole derivatives such as TAZ and 3-(4-tert-butylphenyl)-4-(4-ethylphenyl)-5-(4-biphenylyl)-1,2,4-triazole (hereinafter, referred to as "p-EtTAZ"), and phenanthroline derivatives such as bathophenanthroline (hereinafter, referred to as "BPhen") and BCP have an electron transporting property.

As the electron injecting material, the above-mentioned electron transporting materials can be used. In addition, an extra-thin film of an insulator, such as metal halide such as calcium fluoride, lithium fluoride, or cesium fluoride, or alkali metal-oxide such as lithium oxide, is often used. Further, an alkali-metal complex such as lithium acetyl acetonate (hereinafter, referred to as "Li(acac)") or 8quinolinolato-lithium (hereinafter, referred to as "Liq") is also efficient.

As the luminescent material, in addition to the above-mentioned metal complexes such as Alq, Almq, BeBq, BAlq, Zn(BOX)$_2$, and Zn(BTZ)$_2$, various fluorescent pigments are efficient. The fluorescent pigments include 4,4'-bis(2,2-diphenyl-vinyl)-biphenyl, which is blue, and 4-(dicyanomethylene)-2-methyl-6-(p-dimethylaminostyryl)-4H pyran, which is red-orange. Also, a triplet luminescent material is available, which principally includes a complex with platinum or iridium as a central metal. As the triplet luminescent material, tris (2-phenylpyridine) iridium, bis(2-(4'-tryl)pyridinato-N,C$^{2'}$) acetylacetonato iridium (hereinafter, referred to as "acacIr(tpy)$_2$"), 2, 3, 7, 8, 12, 13, 17, 18, -octaethyl-21H, 23H porphyrin-platinum, an the like are known.

As the hole blocking material, BAlq, OXD-7, TAZ, p-EtTAZ, BPhen, BCP, and the like mentioned above are efficient due to their large ionization potentials.

The electron transporting materials mentioned above are, as n-type organic semiconductors, applicable to the material to be added to the hole blocking material. As n-type inorganic semiconductors, zinc oxide, zinc sulfide, tin oxide, indium oxide can be given.

By combining the materials that have the respective functions, which are mentioned above, to be applied to an organic light-emitting device according to the present invention, a high-reliability organic light-emitting device can be manufactured also in a device to which a hole blocking layer is applied.

EMBODIMENTS

In the present embodiment, the organic light-emitting device according to the present invention, which is shown in FIG. 1, will be exemplified specifically.

Embodiment 1

First, on a glass substrate 101 on which ITO that serves as the anode 102 is deposited to be approximately 100 nm, CuPc that is a hole injecting material is deposited to be 20 nm as the hole injecting layer 103. After that, α-NPD that is a hole transporting material is deposited to be 30 nm as the hole transporting layer 104.

After forming the hole transporting layer, Ir(tpy)$_2$acac that is a triplet luminescent material and 4,4'-N,N'-dicarbazol-biphenyl (hereinafter, referred to as "CBP") that is a host material are deposited by co-evaporation to be a ratio of approximately 2:23 (weight ratio), which means CBP has Ir(tpy)$_2$acac dispersed at a concentration of approximately 8 wt %. This co-evaporated film is deposited to be 30 nm, which is the light-emitting layer 105.

After forming the light-emitting layer, BCP that is a hole blocking material and PBD that is an n-type organic semiconductor are deposited by co-evaporation to be a ratio of 93:7 (weight ratio), which means BCP has PBD dispersed at a concentration of approximately 7.0 wt %. This co-evaporated film is deposited to be 20 nm, which is the hole blocking layer 106.

Next, an electron transporting material Alq is deposited to be 20 nm as the electron transporting layer 107, calcium fluoride (abbreviation: CaF) is deposited to be 2 nm as the electron injecting layer 108, and lastly, Al is deposited to be 150 nm as the cathode 109. This makes it possible to obtain an organic light-emitting device according to the present invention.

Figure 4:
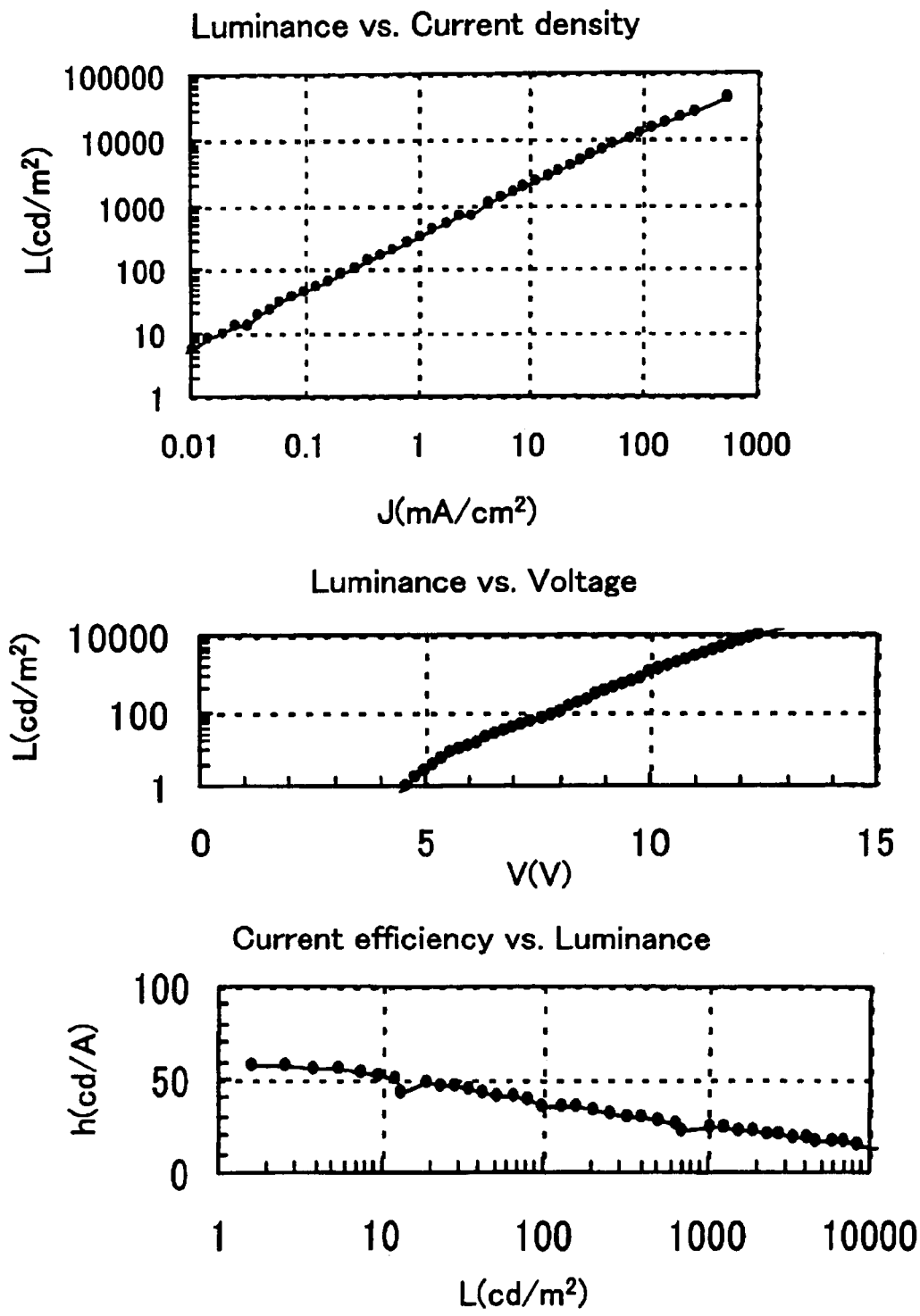
FIG. 4 is a diagram showing initial characteristics of Embodiment 1.

FIG. 4 shows graphs of initial characteristics of this device.

COMPARATIVE EXAMPLE 1

The present comparative example is a comparative example to Embodiment 1. An organic light-emitting device to which a conventional hole blocking layer is applied is manufactured to compare characteristics thereof with those of the device according to the present invention.

First, on a glass substrate 101 on which ITO that serves as the anode 102 is deposited to be approximately 100 nm, CuPc that is a hole injecting material is deposited to be 20 m as the hole injecting layer 103. After that, α-NPD that is a hole transporting material is deposited to be 30 nm as the hole transporting layer 104.

After forming the hole transporting layer, Ir(tpy)$_2$acac that is a triplet luminescent material and CBP that is a host material are deposited by co-evaporation to be a ratio of approximately 2:23 (weight ratio), which means CBP has Ir(tpy)$_2$acac dispersed at a concentration of approximately 8 wt %. This co-evaporated film is deposited to be 30 nm, which is the light-emitting layer 105.

After that, only BCP that is a hole blocking material is deposited to be 20 nm, which is the hole blocking layer 106.

Next, an electron transporting material Alq is deposited to be 20 nm as the electron transporting layer 107, calcium fluoride (abbreviation: CaF) is deposited to be 20 nm as the electron injecting layer 108, and lastly, Al is deposited to be 150 m as the cathode 109.

FIG. 5 shows graphs of initial characteristics of this device.

When FIG. 4 is compared to FIG. 5, the devices of Embodiment 1 and Comparative Example 1 both show largely similar initial characteristics, where driving voltage and current efficiency at 1000 cd/m$^2$ are approximately 8 V and approximately 25 cd/A, respectively. Accordingly, it turns out that properties such as a hole blocking property are not deteriorated at all although the PBD that is the n-type organic semiconductor is added to the conventional hole blocking layer BCP in the device of Embodiment 1 according to the present invention.

Embodiment 2

Next, an organic light-emitting device according to the present invention, which has different materials and device structure from Embodiment 1, is manufactured.

First, on a glass substrate 101 on which ITO that serves as the anode 102 is deposited to be approximately 100 nm, CuPc that is a hole injecting material is deposited to be 20 nm as the hole injecting layer 103. After that, α-NPD that is a hole transporting material is deposited to be 30 nm as the hole transporting layer 104. Next, tris (8-quinolinolato) aluminum (Abbreviation: Alq) that is an electron-transporting luminescent material is deposited to be 50 m as the light-emitting layer 105.

After that, BCP that is a hole blocking material and PBD that is an n-type organic semiconductor are deposited by co-evaporation to be a ratio of 49:1 (weight ratio), which means BCP has PBD dispersed at a concentration of approximately 2 wt %. This co-evaporated film is deposited to be 20 nm, which is the hole blocking layer 106. In this case, this hole blocking layer 106 has an electron transporting function in combination, and therefore doubles as the electron transporting layer 107.

Next, calcium fluoride (abbreviation: CaF) is deposited to be 2 nm as the electron injecting layer 108, and lastly, Al is deposited to be 150 nm as the cathode 109. This makes it possible to obtain the organic light-emitting device according to the present invention.

COMPARATIVE EXAMPLE 2

The present comparative example is a comparative example to Embodiment 2. An organic light-emitting device to which a conventional hole blocking layer is applied is manufactured to compare characteristics thereof with characteristics of the organic light-emitting device of Embodiment 2.

First, on a glass substrate 101 on which ITO that serves as the anode 102 is deposited to be approximately 100 nm, CuPc that is a hole injecting material is deposited to be 20 nm as the hole injecting layer 103. After that, α-NPD that is a hole transporting material is deposited to be 30 nm as the hole transporting layer 104. Next, Alq that is an electron-transporting luminescent material is deposited to be 50 m as the light-emitting layer 105.

After that, only BCP that is a hole blocking material is deposited to be 20 nm, which doubles as the hole blocking layer 106 and the electron transporting layer 107.

Next, calcium fluoride (abbreviation: CaF) is deposited to be 2 nm as the electron injecting layer 108, and lastly, Al is deposited to be 150 nm as the cathode 109.

The devices of Embodiment 2 and Comparative Example 2 both show largely similar initial characteristics, where driving voltage and current efficiency at 1000 cd/m$^2$ are approximately 10 V and approximately 4.4 cd/A, respectively. Accordingly, properties such as a hole blocking property are not deteriorated at all although the PBD that is the n-type organic semiconductor is added to the conventional hole blocking layer BCP in the device of Embodiment 2 according to the present invention.

Figure 6:
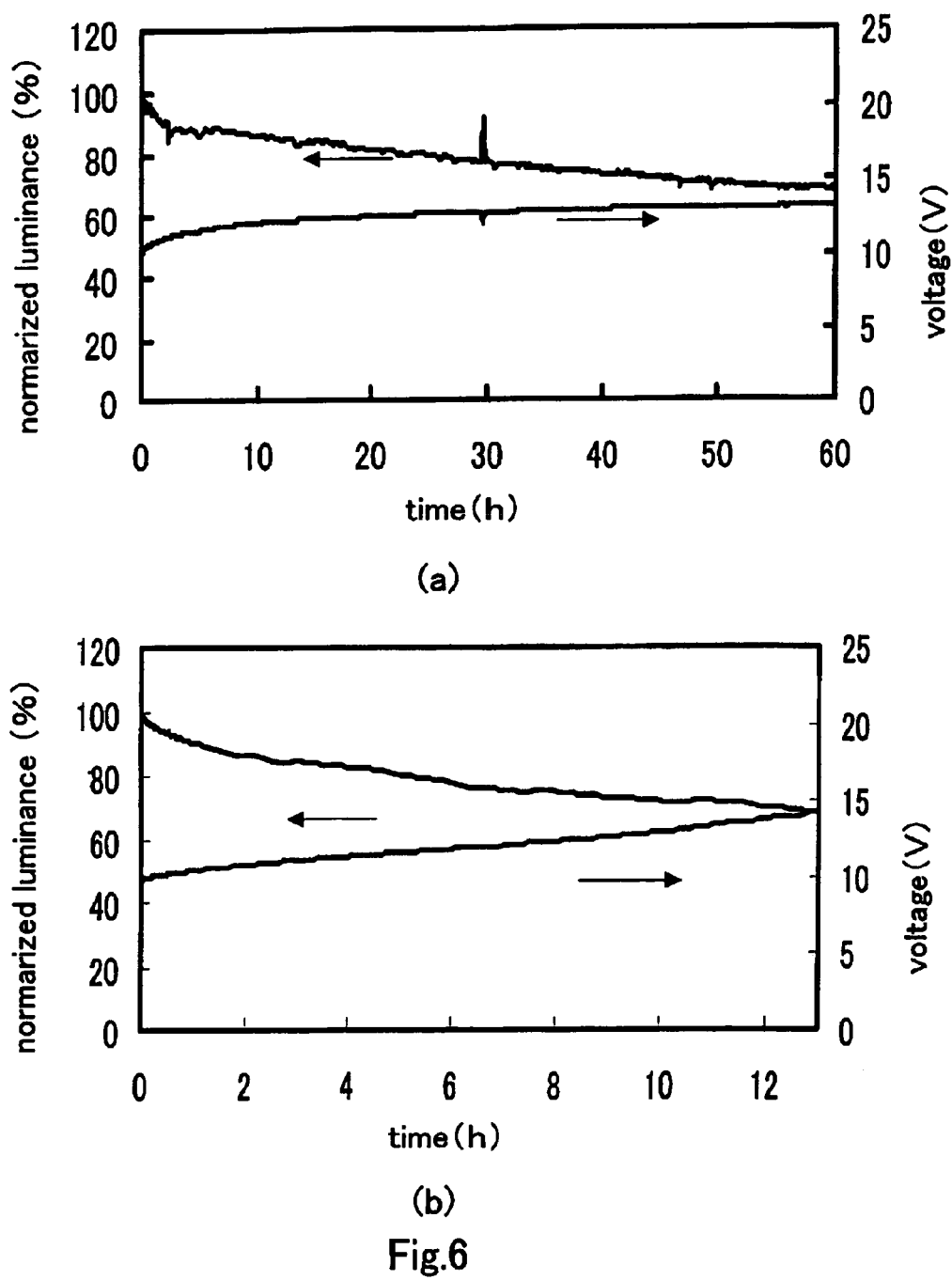
FIGS. 6(a) and 6(b) are diagrams showing reliability characteristics of Embodiment 1 and Comparative Example 1.

Next, FIG. 6(*a*) and FIG. 6(*b*) show a result of a reliability test of the device of Embodiment 2 and a result of a reliability test of the device of Comparative Example 2, respectively. In each case, an initial luminance is set at approximately 1000 cd/m$^2$, an increase in driving voltage and a decrease in luminance are monitored while a constant DC current is kept flowing.

As shown in FIG. 6, as for the device of Comparative Example 2, immediately after driving, the luminance starts to be degraded while the driving voltage starts to be largely increased, and is decreased to 70% of the initial luminance for about 12 hours. In addition, after elapse of about 15 hours, the driving voltage is rapidly increased to result in sudden destruction of the device. On the other hand, as for the device of Embodiment 2, the increase in driving voltage and the decrease in luminance are both slow as compared to the device of Comparative Example 2, and it is after about 50 hours that the luminance is decreased to 70% of the initial luminance, which is four times or more as the device of Comparative Example 2. In addition, no phenomenon such as sudden destruction of the device is observed in spite of elapse of 100 hours.

Embodiment 3

Figure 7:
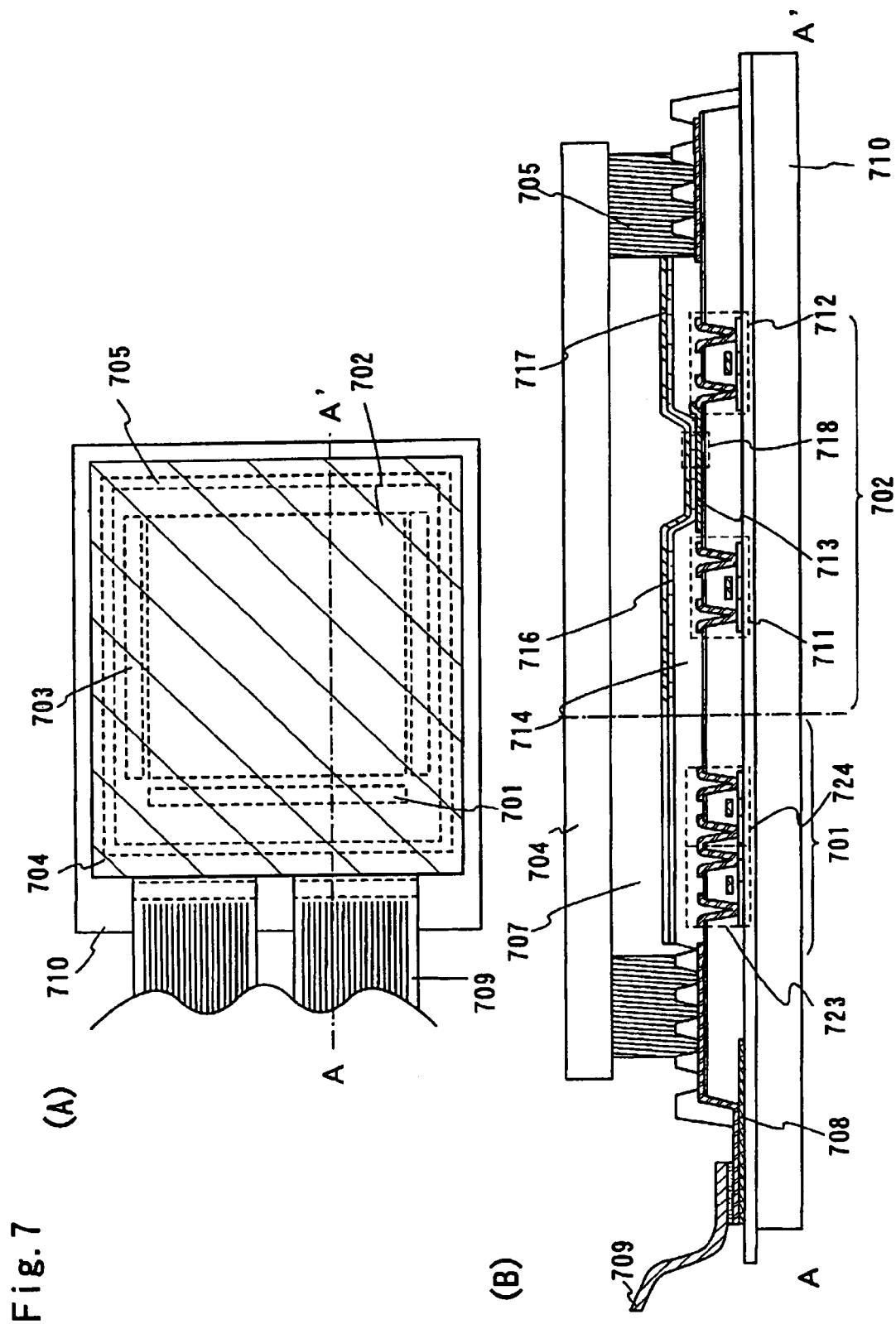
FIGS. 7(A) and 7(B) are diagrams describing a light-emitting device.

In the present embodiment, a light-emitting device that has an organic light-emitting device according to the present invention in a pixel portion will be described with reference to FIG. 7. FIG. 7(A) is a top view showing the light-emitting device and FIG. 7(B) is a sectional view of FIG. 7(A) cut along A-A'. Reference numeral 701 indicated by a dotted line denotes a driver circuit portion (a source side driver circuit), 702 denotes a pixel portion, and 703 denotes a driver circuit portion (a gate side driver circuit). In addition, reference numeral 704 denotes a sealing substrate and 705 denotes a sealing agent. The inside 707 surrounded by the sealing agent 705 is space.

Reference numeral 708 denotes a wiring for transmitting signals to be input to the source side driver circuit 701 and the gate side driver circuit 703, and receives a video signal, a clock signal, a start signal, a reset signal, and the like from FPC (Flexible Printed Circuit) 709 that serves as an external input terminal. Though only the FPC is shown in the figure here, a printed wiring board (PWB) may be attached to the FPC. The light-emitting device in the specification includes not only a light-emitting device body but also a state where an FPC or a PWB is attached thereto.

Next, the sectional structure will be explained with reference to FIG. 7(B). The driver circuits and the pixel portion are formed over a substrate 410. Here, the source side driver circuit 701 as the driver circuit portion and the pixel portion 702 are shown.

In the source side driver circuit 701, a CMOS circuit is formed of a combination of an n-channel TFT 723 and a p-channel TFT 724. The TFTs forming the driver circuit may also be formed of a known CMOS circuit, PMOS circuit, or NMOS circuit. Although the present embodiment mode shows a driver integrated type in which a driver circuit is formed over a substrate, which is not always necessary, the driver circuit can be formed not on the device substrate but at the outside thereof.

The pixel portion 702 is formed of a plurality of pixels, each including a switching TFT 711, a current controlling TFT 712, and a first electrode 713 connected to a drain thereof electrically. In addition, an insulator 714 is formed to cover an edge of the first electrode 713. Here, a positive photosensitive acrylic resin film is used to form the insulator 714.

Besides, in order to obtain a favorable coverage, the insulator 714 has a top portion or bottom potion formed with a curved surface with a curvature. For example, in the case of using positive photosensitive acrylic as a material of the insulator 714, it is preferable that only the top portion of the insulator 714 has a curved surface with a curvature radius (0.2 μm to 3 μm). In addition, any of a photosensitive negative type that becomes insoluble in an etchant by light and a positive type that becomes soluble in an etchant by light can be used as the insulator 714.

On the first electrode 713, an electroluminescent film 716 and a second electrode 717 are respectively formed. Here, as a material that is used for the first electrode 713 functioning as an anode, it is preferable to use a material that has a large work function. For example, in addition to single layers such as an ITO (indium tin oxide) film, an indium zinc oxide (IZO) film, a titanium nitride film, a chromium film, a tungsten film, a Zn film, and a Pt film, a laminate of a titanium nitride film and a film including aluminum as its main component, a three-layer structure of a titanium nitride film, a film including aluminum as its main component, and a titanium nitride film, and the like can be used. When a laminated structure is employed, the resistance as a wiring is low, favorable ohmic contact can be taken, and it is possible to function as an anode.

Further, the electroluminescent film 716 is formed by evaporation that uses an evaporation mask or by inkjet. For the electroluminescent film 716, as a part thereof, a phosphorescent compound according to the present invention is used, and as the other materials that can be used in combination, a low molecular weight material and a high molecular weight material may be given. In addition, it is often the case that an organic compound for a single layer or a laminate is generally used as a material that is used for an electroluminescent film. However, the present invention includes a structure in which an inorganic compound is used for a part of a film comprising an organic compound.

In addition, as a material that is used for the second electrode (cathode) 717 formed on the electroluminescent film 716, a material that has a small work function (Al, Ag, Li, Ca, an alloy thereof such as MgAg, MgIn, AlLi, $CaF_2$, or CaN) may be used. In the case of transmitting light generated in the electroluminescent film 716 through the second electrode 717, it is preferable to use a laminate of a thinned metal and a transparent conductive film (such as ITO (an alloy of indium oxide and tin oxide), an alloy of indium oxide and zinc oxide ($In_2O_3$—ZnO), or zinc oxide (ZnO)) film as the second electrode (cathode) 717.

Further, a structure is obtained by bonding the sealing substrate 704 and the device substrate 710 with the sealing agent 705, where an organic light-emitting device 718 is equipped in the space 707 surrounded by the device substrate 701, the sealing substrate 704, and the sealing agent 705. The space 707 also includes a structure of filling with the sealing agent 705 in addition to a case of filling with inert gas (such as nitrogen or argon).

It is preferable to use epoxy resin for the sealing agent 705. In addition, it is desirable that these materials are a material that allows no permeation of moisture or oxygen as much as possible. Further, as a material that is used for the sealing substrate 704, a plastic substrate comprising FRP (Fiberglass-Reinforced Plastics), PVF (polyvinylfluoride), Mylar, polyester, acrylic, or the like can be used besides a glass substrate and a quarts substrate.

In this way, the light-emitting device that has the organic light-emitting device according to the present invention can be obtained.

Embodiment 4

In the present embodiment, various electronic appliances completed with the use of a light-emitting device that has an organic light-emitting device according to the present invention will be described.

As electronic appliances manufactured with the use of a light-emitting device that has an organic light-emitting device according to the present invention, a video camera, a digital camera, a goggle-type display (head mount display), a navigation system, a sound reproduction device (such as an in-car audio system or an audio set), a laptop personal computer, a game machine, a personal digital assistant (such as a mobile computer, a mobile phone, a portable game machine, or an electronic book), an image reproduction device equipped with a recording medium (specifically, a device equipped with a display device, which can reproduce a recording medium such as a digital versatile disc (DVD) and display the image), and the like can be given. FIG. 8 shows specific examples of these electronic appliances.

FIG. 8(A) is a display device, which includes a frame body 8101, a support 8102, a display portion 8103, a speaker portion 8104, a video input terminal 8105, and the like. A light-emitting device that has an organic light-emitting device according to the present invention is used for the display portion 8103 to manufacture the display device. The display device includes all devices for displaying information such as for a personal computer, for receiving TV broadcasting, and for displaying an advertisement.

FIG. 8(B) is a laptop personal computer, which includes a main body 8201, a frame body 8202, a display portion 8203, a keyboard 8204, an external connection port 8205, a pointing mouse 8206, and the like. A light-emitting device that has an organic light-emitting device according to the present invention is used for the display portion 8203 to manufacture the laptop personal computer.

FIG. 8(C) is a mobile computer, which includes a main body 8301, a display portion 8302, a switch 8303, an operation key 8304, an infrared port 8305, and the like. A light-emitting device that has an organic light-emitting device according to the present invention is used for the display portion 8302 to manufacture the mobile computer.

FIG. 8(D) is a portable image reproduction device equipped with a recording medium (specifically, a DVD reproduction device), which includes a main body 8401, a frame body 8402, a display portion A 8403, a display portion B 8404, a recording medium (such as DVD) reading portion 8405, an operation key 8406, a speaker portion 8407, and the like. The display portion A 8403 is used mainly for displaying image information while the display portion B 8404 is used mainly for displaying character information, and a light-emitting device that has an organic light-emitting device according to the present invention is used for these display portion A 8403 and display portion B 8404 to manufacture the portable image reproduction device equipped with the recording medium. The image reproduction device equipped with the recording medium further includes a home game machine and the like.

FIG. 8(E) is a goggle-type display (head mount display), which includes a main body 8501, a display portion 8502, an arm portion 8503, and the like. A light-emitting device that has an organic light-emitting device according to the present invention is used for the display portion 8502 to manufacture the goggle-type display.

FIG. 8(F) is a video camera, which includes a main body 8601, a display portion 8602, a frame body 8603, an external connection port 8604, a remote control receiving portion 8605, an image receiving portion 8606, a battery 8607, a sound input portion 8608, an operation key 8609, an eye piece 8610, and the like. A light-emitting device that has an organic light-emitting device according to the present invention is used for the display portion 8602 to manufacture the video camera.

FIG. 8(G) is a mobile phone, which includes a main body 8701, a frame body 8702, a display portion 8703, a voice input portion 8704, a voice output portion 8705, an operation key 8706, an external connection port 8707, an antenna 8708, and the like. A light-emitting device that has an organic light-emitting device according to the present invention is used for the display portion 8703 to manufacture the mobile phone. The mobile phone can have power consumption suppressed by displaying white characters on a black background in the display portion 8703.

INDUSTRIAL APPLICABILITY

As described above, a light-emitting device that has an organic light-emitting device according to the present invention is quite widely applied, and is applicable to electronic appliances in all fields.

The invention claimed is:

1. A light-emitting device comprising:
an anode;
a cathode;
a light-emitting layer provided between the anode and the cathode; and
a hole blocking layer provided in contact with a cathode side of the light-emitting layer,
wherein the hole blocking layer comprises a hole blocking material that has a larger ionization potential than an ionization potential of the light-emitting layer and one kind or plural kinds of n-type inorganic semiconductor materials, and
wherein a value of an energy gap of the hole blocking layer is larger than a value of an energy gap of the light-emitting layer.

2. The light-emitting device according to claim 1, wherein a value of an ionization potential of each of the n-type inorganic semiconductor materials is larger than a value of the ionization potential of the light-emitting layer.

3. The light-emitting device according to claim 1, wherein a value of an energy gap of each of the n-type inorganic semiconductor materials between a top value of a valence band and a bottom value of a conduction band is larger than a value of an energy gap of the light-emitting layer between a highest occupied molecular orbital level and a lowest unoccupied molecular orbital level.

4. The light-emitting device according to claim 1, wherein an energy value of an absorption edge of each of the n-type inorganic semiconductor materials is larger than an energy value of an absorption edge of the light-emitting layer.

5. The light-emitting device according to claim 1, wherein a value of the ionization potential of the hole blocking layer is 0.4 eV or more larger than a value of the ionization potential of the light-emitting layer.

6. The light-emitting device according to claim 1, wherein a value of the ionization potential of the hole blocking layer is 5.8 eV or more.

7. The light-emitting device according to claim 1, wherein the hole blocking material is any one of BAlq, OXD-7, TAZ, p-EtTAZ, BPhen, and BCP.

8. The light-emitting device according to claim 1, wherein the light-emitting device is an organic light-emitting device.

9. The light-emitting device according to claim 8, wherein an electronic appliance uses the light-emitting device.

10. The light-emitting device according to claim 9, wherein the electronic appliance is any one of a video camera, a digital camera, a goggle-type display, a navigation system, a sound reproduction device, a laptop personal computer, a game machine, a personal digital assistant, and image reproduction device equipped with a recording medium.

11. A light-emitting device comprising:
an anode;
a cathode;
a light-emitting layer provided between the anode and the cathode; and
a hole blocking layer provided in contact with a cathode side of the light-emitting layer,
wherein the hole blocking layer comprises a hole blocking material that has a larger ionization potential than an ionization potential of the light-emitting layer, and one kind or plural kinds of n-type inorganic semiconductor materials,
wherein a value of an ionization potential of each of the n-type inorganic semiconductor materials is larger than a value of the ionization potential of the light-emitting layer, and
wherein a value of an energy gap of the hole blocking layer is larger than a value of an energy gap of the light-emitting layer.

12. A light-emitting device comprising:
an anode;
a cathode;
a light-emitting layer provided between the anode and the cathode; and
a hole blocking layer provided in contact with a cathode side of the light-emitting layer,
wherein the hole blocking layer comprises a hole blocking material that has a larger ionization potential than an ionization potential of the light-emitting layer, and one kind or plural kinds of n-type inorganic semiconductor materials,
wherein a value of an ionization potential of each of the n-type inorganic semiconductor materials is larger than a value of the ionization potential of the light-emitting layer,
wherein the n-type inorganic semiconductor materials are selected from a group consisting of zinc oxide, zinc sulfide, tin oxide and indium oxide, and
wherein a value of an energy gap of the hole blocking layer is larger than a value of an energy gap of the light-emitting layer.

13. The light-emitting device according to claim 11, wherein a value of the ionization potential of the hole blocking layer is 0.4 eV or more larger than a value of the ionization potential of the light-emitting layer.

14. The light-emitting device according to claim 11, wherein a value of the ionization potential of the hole blocking layer is 5.8 eV or more.

15. The light-emitting device according to claim 11, wherein the hole blocking material is any one of BAlq, OXD-7, TAZ, p-EtTAZ, BPhen, and BCP.

16. The light-emitting device according to claim 12, wherein a value of the ionization potential of the hole blocking layer is 0.4 eV or more larger than a value of the ionization potential of the light-emitting layer.

17. The light-emitting device according to claim 12, wherein a value of the ionization potential of the hole blocking layer is 5.8 eV or more.

18. The light-emitting device according to claim 12, wherein the hole blocking material is any one of BAlq, OXD-7, TAZ, p-EtTAZ, BPhen, and BCP.

* * * * *